United States Patent [19]
Finley et al.

[11] Patent Number: 5,965,278
[45] Date of Patent: Oct. 12, 1999

[54] METHOD OF MAKING CATHODE TARGETS COMPRISING SILICON

[75] Inventors: James J. Finley, O'Hara Township; Thomas J. Waynar, New Kensington; Larry A. Miller, Buffalo Township, all of Pa.

[73] Assignee: PPG Industries Ohio, Inc., Cleveland, Ohio

[21] Appl. No.: 08/042,185

[22] Filed: Apr. 2, 1993

[51] Int. Cl.$^6$ .............................. B32B 15/04; C23C 14/16
[52] U.S. Cl. ...................... 428/641; 428/937; 228/208; 228/123.1; 204/298.13
[58] Field of Search ..................... 428/641, 650, 428/652, 642, 646, 647, 937; 228/208, 123.1, 261, 245; 204/298.13

[56] References Cited

U.S. PATENT DOCUMENTS

| | | | |
|---|---|---|---|
| 3,922,385 | 11/1975 | Konantz et al. | 427/427 |
| 4,209,375 | 6/1980 | Gates et al. | 204/298.12 |
| 4,297,391 | 10/1981 | Lindmayer | 427/456 |
| 4,320,251 | 3/1982 | Narasihan et al. | 427/455 |
| 4,341,816 | 7/1982 | Lauterbach et al. | 427/423 |
| 4,450,201 | 5/1984 | Brill et al. | 428/336 |
| 4,492,812 | 1/1985 | Lindmayer | 427/455 |
| 4,511,600 | 4/1985 | Leas | 427/427 |
| 4,847,157 | 7/1989 | Goodman et al. | 428/426 |
| 4,978,437 | 12/1990 | Wirz | 204/298.12 |
| 4,990,234 | 2/1991 | Szczyrbowski et al. | 204/192.23 |
| 4,992,087 | 2/1991 | Holscher | 65/60.2 |
| 4,995,895 | 2/1991 | Groth et al. | 65/60.2 |
| 5,170,291 | 12/1992 | Szczyrbowski et al. | 359/580 |
| 5,185,183 | 2/1993 | Gonda et al. | 427/427 |
| 5,215,639 | 6/1993 | Boys | 204/298.12 |

FOREIGN PATENT DOCUMENTS

| | | |
|---|---|---|
| 0 226 993 | 7/1987 | European Pat. Off. . |
| 0 239 280 | 9/1987 | European Pat. Off. . |
| 0 281 894 | 9/1988 | European Pat. Off. . |
| 0 301 755 | 2/1989 | European Pat. Off. . |
| 63-242948 | 10/1988 | Japan . |
| 2201428 | 9/1988 | United Kingdom . |

OTHER PUBLICATIONS

"Properties of d.c. Magnetron Sputtered $NiSiO_x$–Films" by J. Szczyrbowski et al., SPIE vol. 1272, pp. 38–45, *Optical Materials Technology for Energy Efficiency and Solar Energy Conversion IX* (1990) (no month).

Francois et al., "Reflectivity of $ScN_x$ Thin Films: Comparison with $TiN_x$, $TiN_xC_y$ and $ZrN_x$ Coatings and Applications to the Photothermal Conversion of Solar Energy", *Thin Solid Films*, 127 (1985) (no month) pp. 205–214.

Valkonen et al., "Selective Transmission of Thin TiN–films", *SPIE Int. Soc. Opt. Eng.*, 1983, (no month) pp. 375–380.

W.E. Ballard, Metal Spraying and Sprayed Metal, $3^{rd}$ Ed., Charles Griffin & Co. Ltd, London, 1948 (no month), pp. 95–119.

*Primary Examiner*—John J. Zimmerman
*Attorney, Agent, or Firm*—Kenneth J. Stachel

[57] ABSTRACT

A method for bonding silicon-containing compositions to metal surfaces is disclosed wherein a coarse silicon-containing surface is arc-sprayed with a first adhesive layer, a second solderable layer, and a third solder layer, and the arc-sprayed surface is then soldered to the metal surface. The method is particularly useful for producing silicon-containing targets for cathode sputtering.

5 Claims, 1 Drawing Sheet

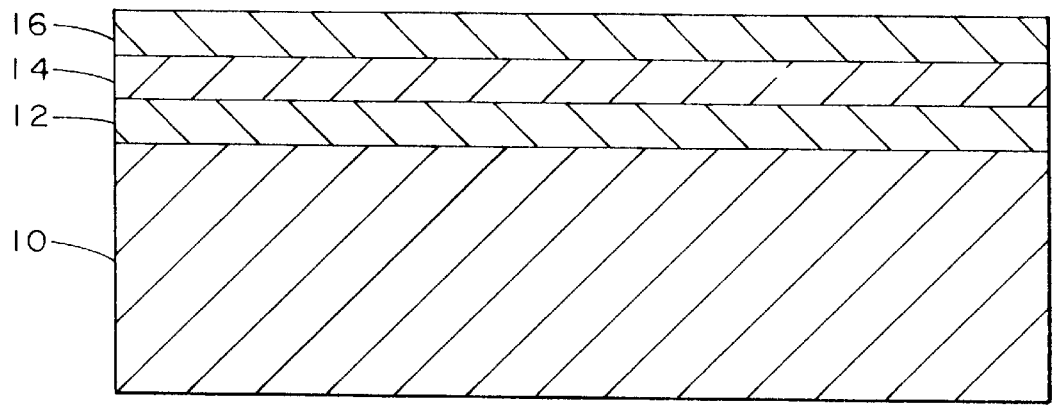
F I G. 1
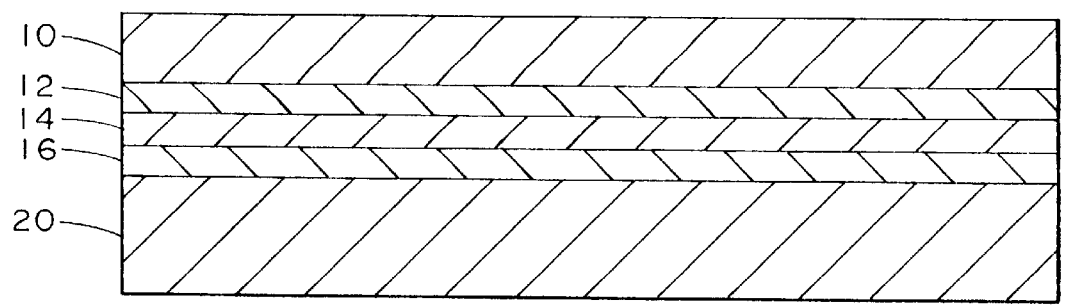
F I G. 2

METHOD OF MAKING CATHODE TARGETS COMPRISING SILICON

BACKGROUND OF THE INVENTION

1. Field of the Invention

The present invention relates generally to the art of silicon-containing cathode target materials, and more particularly to the art of bonding silicon-containing targets to metal backing plates.

2. Description of the Prior Art

U.S. Pat. No. 4,341,816 to Lauterbach et al. discloses disc or plate shaped targets for sputtering attached to cooling plates by plasma-spraying a surface of such targets with a compatible adhesive layer such as nickel, nickel/chromium, nickel/aluminum, nickel/aluminum/molybdenum, aluminum/bronze, molybdenum, aluminum/silicon, zinc, copper or copper/glass; and then coating the adhesive layer with a solderable layer such as copper, copper/glass or silver; and soldering the solderable layer onto the surface of a cooling plate. The adhesive layer and solderable layer are applied via plasma spraying.

Silicon is difficult to wet with solder and requires a metallization layer. It is well known in the semiconductor industry that silicon can be metallized with aluminum to form electrodes for solar cells or contacts on integrated circuits. In addition, the metallization of sputtering targets, including the use of an aluminum layer applied to silicon by plasma spraying, is known.

BRIEF DESCRIPTION OF THE DRAWING

FIG. 1 is a cross-section illustrating the silicon-containing target material 10 onto which are coated layers of adhesive 12, solderable material 14, and soldering alloy 16 by arc-spraying.

FIG. 2 is a cross-section illustrating the coated target of FIG. 1 bonded to a metal backing plate 20.

SUMMARY OF THE INVENTION

The present invention involves metallizing silicon targets with aluminum or aluminum alloys by arc-spraying. Arc-spraying functions well for metallization. Mechanicals tests for bond strength measurements resulted in the silicon fracturing before the metallized bond, and cathode power tests exceeded 200% of production levels without any solder melting.

DESCRIPTION OF THE PREFERRED EMBODIMENT

The invention involves a method of producing a cathode for sputtering silicon and silicon compounds. The method comprises grit blasting the silicon plate, preferably with a coarse, angular, granular grit such as aluminum oxide, silicon carbide, or boiler slag, which is typically an amorphous mixture of iron, aluminum and calcium silicates. A particle size less than 70 grit is preferred. The grit blasted surface of the silicon plate is then arc-sprayed. A mixture of 12 to 40 grit (12/40) is particularly preferred with an adhesion layer, preferably aluminum or aluminum alloy, followed by a solderable layer, preferably a metal wettable by solder, such as copper, copper alloys and nickel alloys, preferably copper, followed by a solder layer. The aluminum and copper layers are preferably between 0.002 and 0.020 inch (0.05 to 0.5 millimeter) thick. The solder layer should be thick enough to completely cover the copper, typically at least 0.02 inch (0.5 millimeter). The solder is preferably tin, indium or alloys thereof.

The grit blasted surface greatly improves adhesion. A preferred grit material is boiler slag. The solder layer provides protection against oxidation of the copper layer during soldering, in addition to functioning as solder layer.

The method of the present invention further involves grit blasting the metal backing plate, arc-spraying the metal backing plate, preferably copper, with a solder layer. If it is difficult to wet the metal backing plate with solder, the plate may need an additional arc-sprayed solderable layer.

The arc-sprayed solder bonds well enough to the metal plate, e.g. copper, to reduce or eliminate the use of flux when bonding the metallized silicon plate to the metal plate. This reduces the chance of trapping excess flux between the coated silicon tile and metal backing plate. This trapped flux causes outgassing or debonding during cathode operation.

The method of the present invention further involves bonding by soldering the metallized silicon plate to the metal plate, arc-sprayed with solder, to form a cathode for sputtering.

The present invention may be practiced with silicon-nickel alloys ranging from 3 to 18 weight percent nickel. Such targets of silicon-nickel alloys are sputtered in an atmosphere comprising nitrogen, oxygen, inert gases and mixtures thereof to produce silicon-nickel containing coatings including oxides, nitrides and oxynitrides. These silicon-nickel compositions comprise sufficient nickel to provide target stability and a desirable sputtering rate while keeping the absorption of the resulting films relatively low.

For effective sputtering, the targets must be bonded to backing plates with a mechanically strong and electrically conductive bond that is stable at sputtering temperatures. In addition, the thermal conductivity of the backing plate must be sufficiently high to provide adequate cooling during sputtering to avoid debonding. Since many conventional methods of soldering do not wet silicon, a primer layer deposited by arc-spray is utilized. Bonding schemes for copper, titanium, and molybdenum plates have been developed and tested. Although the thermal coefficient of expansion match is important over the temperature range of the solder, there has been no cracking of the silicon or debonding of the silicon from the target plate during or after cooling.

In a preferred embodiment of the present invention, coatings are produced on a large-scale magnetron sputtering device capable of coating glass up to 100×144 inches (2.54×3.66 meters) using cathodes having 13 by 106 inch (23 by 269 centimeter) targets. In other instances, the coatings are deposited on a smaller scale, using planar magnetron cathodes having 5×17 inch (12.7×43.2 centimeters) silicon-nickel targets. Base pressure is in the $10^{-6}$ Torr range. The coatings are made by first admitting the sputtering gas to a pressure of 4 millitorr and then setting the cathode at constant power of 3 kilowatts (kw). In each example, 6 millimeter thick glass substrates pass under the target on a conveyor roll at a speed of 120 inches (3.05 meters) per minute. For testing the bond strength of the silicon-containing targets, cathode power up to 200 percent of normal production levels is applied.

To test the bond strength for silicon, layers of aluminum, copper and babbitt metal were sprayed sequentially onto two sides of a one inch (2.54 cm) square silicon tile and onto one side of two 1×1.5×0.25 inch (2.54×3.8×0.6 centimeter) copper plates. The silicon and copper were sand blasted using 12/40 grit boiler slag. The sandblasted surfaces were then arc-sprayed with aluminum, copper, and babbitt metal alloy. The babbitt metal alloy surfaces were then coated with non-corrosive soldering flux to prevent oxidation. The coated silicon tile was then sandwiched between the copper plate with all babbitt metal alloy surfaces touching. The surfaces were then soldered by heating the sandwich in a furnace at 800° F. (427° C.) for approximately 5 minutes until the surfaces fused together. The sandwich was then removed from the furnace and allowed to cool. This silicon and copper configuration was pull tested on an Instron Model 1127 (Instron Corp., Canton, Mass.) apparatus at 640 pounds. The silicon broke in half, but did not debond.

The following table shows the metals, currents and spray pressure of the arc-spray system (TAFA Model 8830), (TAFA, Inc., Concord, N.H.) used in the examples herein.

TABLE

| Wire Type | Dimension | | Spray Pressure | | |
| --- | --- | --- | --- | --- | --- |
| | inch | millimeter | (psi) | Volts | Amps |
| aluminum | 1/16 | 1.6 | 40 | 35 | 150 |
| copper | 1/16 | 1.6 | 40 | 35 | 150 |
| babbitt metal alloy | 0.08 | 2.0 | 40 | 29 | 100 |

With the above conditions, 6 passes of aluminum (1 pass equals about 1 second access to the substrate) result in deposition of a layer approximately 0.015 inch (0.38 mm) thick, 6 passes of copper result in deposition of a layer 0.015 inch (0.38 mm) thick, and 10 passes of babbitt alloy result in deposition of a layer of sufficient thickness to completely cover the copper layer, preferably at least about 0.02 inch (0.51 millimeter). Tin, indium and alloys thereof may also be used in place of the babbitt metal alloy.

The same thickness coating could be obtained by varying voltage settings, spray pressures and current ranges along with the number of passes. It is important, however, to prevent the silicon tile from overheating during spraying. When this occurs, the metallized layer will peel from the silicon. Air jet cooling can be used to keep the silicon tile cool during spraying if higher throughput is necessary.

EXAMPLE I

A silicon-containing composition is cast in a mold. The resulting silicon-containing casting is cut to the desired size to form a silicon tile. To prepare the silicon tile for metallization, the surface to be bonded is grit blasted, using coarse blasting media (12/40). The surface to be bonded is not touched without gloves after grit blasting. The grit blasted tile surface is cleaned with compressed air to eliminate dust. To metallize the silicon tile, the sandblasted surface is arc-sprayed with a layer of each of the following materials in the order and of the thicknesses listed.

| Layer | Metal | Thickness | |
| --- | --- | --- | --- |
| | | (inch) | (millimeter) |
| 1st | aluminum | 0.010 | 0.25 |
| 2nd | copper | 0.010 | 0.25 |
| 3rd | babbitt | 0.020 | 0.51 |

To prepare the copper backing plate sections for bonding of the silicon-containing target tile, the surface of the backing plate to be bonded is machined and degreased. The areas to be soldered are masked, and the surface is sprayed with layout dye bluing the exposed areas (areas not to be soldered). The mask is removed, and the copper is arc-sprayed with babbitt metal alloy to cover the copper completely, for example, about 0.020 inch (0.51 millimeter).

To form the silicon cathode plate section, i.e. to bond the silicon tile to the copper backing plate section, the copper backing plate section is arc-sprayed with babbitt metal alloy. The arc-sprayed silicon tile and backing plate are placed in a tin bath to wet the metallized surfaces with tin. The wet silicon surface is placed flush against the wet tinned surface of the copper and aligned with no gaps or pockets between the surfaces. Excess solder is removed from all plate surfaces, and the plate is allowed to cool.

EXAMPLE II

For bonding of silicon to molybdenum, titanium or aluminum plates, the silicon tile was prepared as described in Example I. Then a 10×6×3/8 inch (25.4×15.2×0.95 centimeter) thick plate of the desired metal is arc-sprayed first with copper and then with babbitt metal alloy. The silicon tile is then mounted on the plate and soldered as described in Example I.

EXAMPLE III

For the bonding of silicon to a copper backing plate, the silicon tile was prepared as described in Example I, and the copper plate was arc-sprayed with copper and then with babbitt metal alloy. The silicon plate was then mounted on the copper plate as described in Example I.

The above examples are offered to illustrate the present invention. Other silicon-containing compositions may be bonded in accordance with the method of the present invention, using other adhesive metal layers, other solderable layers, other babbitt metals and other solder compositions. The scope of the present invention is defined by the following claims.

What is claimed is:

1. A method for bonding a silicon-containing composition to a metal surface comprising the steps of:
   a. providing a coarse silicon-containing surface;
   b. arc-spraying a metal adhesion layer onto the coarse silicon-containing surface;
   c. arc-spraying a solderable layer onto the metal adhesion layer;
   d. arc-spraying a solder layer onto the solderable layer;
   e. soldering the solder layer to the metal surface, and
   f. arc-spraying a metal layer onto the metal surface to be bonded to the silicon-containing surface.

2. A method according to claim 1, comprising the additional step of arc-spraying a layer of solder onto the metal layer.

3. An article for cathode sputtering silicon-containing compositions comprising:
   a. a silicon-containing composition; and
   b. on at least one surface portion thereof an arc-sprayed layer of metal;
   c. an arc-sprayed solderable layer on the arc-sprayed layer of metal;
   d. an arc-sprayed layer of solder on the solderable layer;
   e. a metal backing plate bonded to said solder layer, wherein the metal is selected from the group consisting of copper, aluminum, titanium and molybdenum and wherein a surface of said metal backing plate is arc-sprayed with a layer of metal selected from the group consisting of copper, tin, indium and alloys thereof.

4. An article according to claim 3, wherein said surface comprises an arc-sprayed layer of solder over an arc-sprayed layer comprising copper.

5. An article according to claim 4, wherein said solder is selected from the group consisting of tin, indium and alloys thereof.

* * * * *